United States Patent
Sheng et al.

(10) Patent No.: US 11,532,464 B2
(45) Date of Patent: Dec. 20, 2022

(54) REACTOR DESIGN FOR LARGE-AREA VHF PLASMA PROCESSING WITH IMPROVED UNIFORMITY

(71) Applicant: Applied Materials, Inc., Santa Clara, CA (US)

(72) Inventors: Shuran Sheng, Saratoga, CA (US); Shinobu Abe, Osaka (JP); Keita Kuwahara, Osaka (JP); Chang Hee Shin, Milpitas, CA (US); Su Ho Cho, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 410 days.

(21) Appl. No.: 15/898,133

(22) Filed: Feb. 15, 2018

(65) Prior Publication Data

US 2019/0252161 A1   Aug. 15, 2019

(51) Int. Cl.
*H01J 37/32* (2006.01)

(52) U.S. Cl.
CPC .... *H01J 37/32669* (2013.01); *H01J 37/3244* (2013.01); *H01J 37/32183* (2013.01)

(58) Field of Classification Search
CPC .......... H01J 37/32669; H01J 37/32183; H01J 37/3244; H01J 37/32082; H01J 37/32137; H01J 37/32144; H01J 37/32357; H01J 37/32651; H01J 37/32091; H01J 2237/3323; H01J 2237/3321; H01J 37/321; H01J 37/3211; H01J 37/32348; H01J 37/32541; H01J 37/3255; H01J 37/32559; H01J 37/32568; H01J 37/32623; H01J 37/32715; H01J 37/32366–32385; H01J 37/32422; H01J 37/32431; H01J 37/32532–32605; H01J 37/3266–32688; H01L 21/02274; C23C 16/509; C23C 16/45565; C23C 16/452; H01R 13/7193

See application file for complete search history.

(56) References Cited

U.S. PATENT DOCUMENTS 5,614,055 A * 3/1997 Fairbairn ............... H01J 37/321
   156/345.33
5,846,883 A * 12/1998 Moslehi ................. H01J 37/321
   438/711

(Continued)

FOREIGN PATENT DOCUMENTS

JP   2004296553 A  * 10/2004
WO  2018026731 A1   2/2018

*Primary Examiner* — Benjamin Kendall
*Assistant Examiner* — Kurt Sweely
(74) *Attorney, Agent, or Firm* — Patterson + Sheridan, LLP

(57) ABSTRACT

An apparatus for plasma processing of substrates is disclosed. A plasma processing chamber is provided which includes a chamber body and a lid. The lid includes a faceplate coupled to a backing plate. The faceplate and the backing plate are disposed within a processing volume defined by the chamber body and the lid. One or more ferrite blocks are coupled to the backing plate to modulate an electromagnetic field created by an RF current from an RF generator. A gas feed assembly including a gas source, a remote plasma source, and a zero field feed through are coupled to, and in fluid communication with, the processing volume through the backing plate and faceplate.

23 Claims, 8 Drawing Sheets

(56) References Cited

U.S. PATENT DOCUMENTS

| | | | |
|---|---|---|---|
| 6,333,601 B1* | 12/2001 | Wickramanayaka | ........................ H01J 37/32091 315/111.41 |
| 6,806,653 B2* | 10/2004 | Strang | ............... H01J 37/32174 118/723 E |
| 2001/0006093 A1* | 7/2001 | Tabuchi | ................... C23C 16/24 156/345.43 |
| 2002/0047543 A1* | 4/2002 | Sugai | ................ H01J 37/32082 315/111.21 |
| 2002/0069968 A1* | 6/2002 | Keller | ................... C23C 16/455 156/345.33 |
| 2005/0178748 A1* | 8/2005 | Buchberger, Jr. | ........................... H01J 37/32082 219/121.48 |
| 2005/0221618 A1* | 10/2005 | AmRhein | .............. C23C 16/452 438/710 |
| 2008/0260966 A1* | 10/2008 | Hanawa | .............. H01J 37/3266 427/569 |
| 2009/0022905 A1* | 1/2009 | Kudela | ................. C23C 16/455 427/569 |
| 2010/0104771 A1* | 4/2010 | Kudela | ............. H01J 37/32091 427/569 |
| 2010/0104772 A1* | 4/2010 | Kudela | ............. H01J 37/32091 427/569 |
| 2015/0053135 A1* | 2/2015 | Chung | .............. H01J 37/32091 118/723 E |

\* cited by examiner

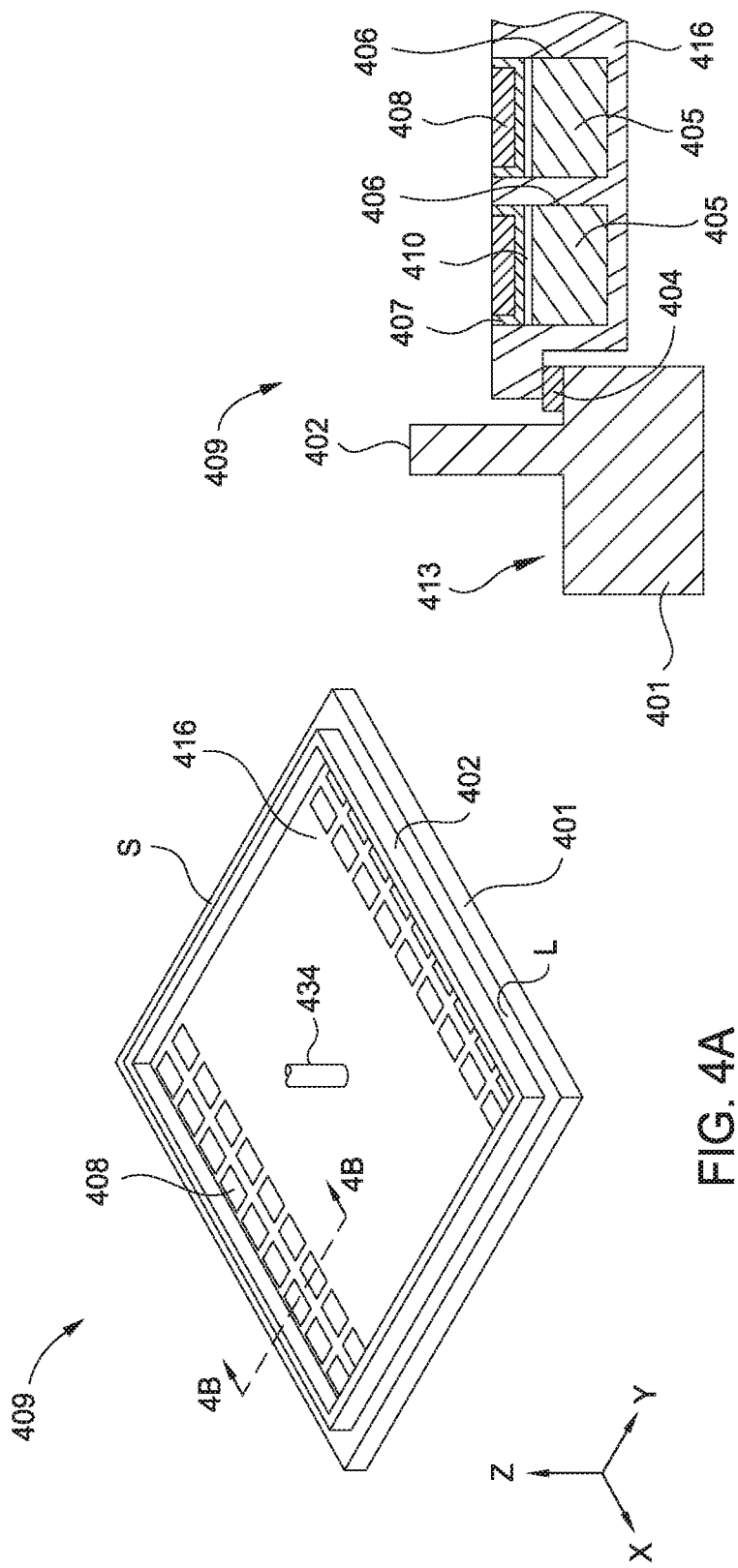

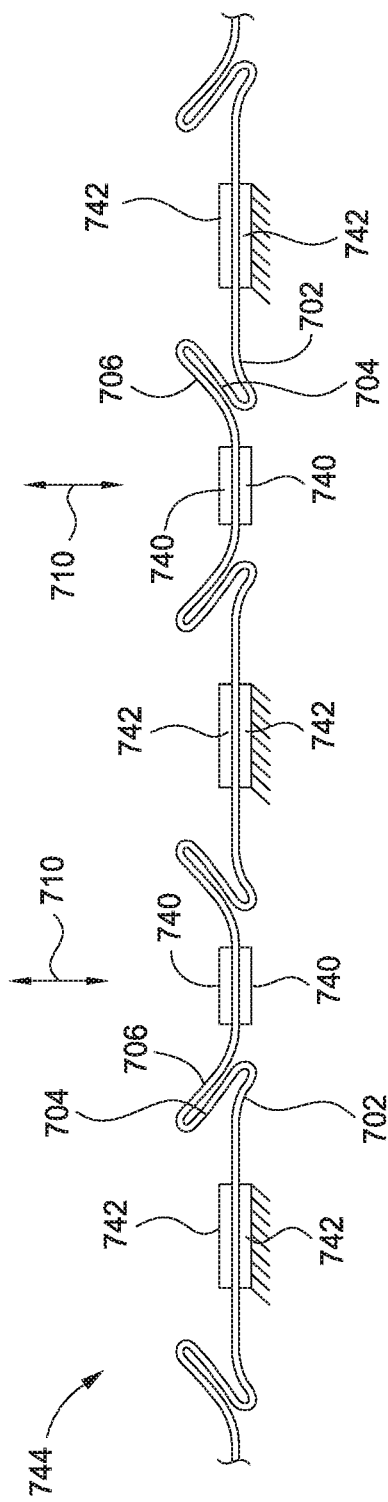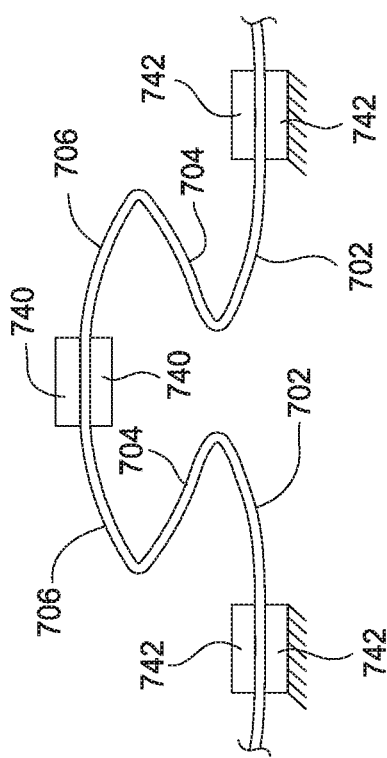

REACTOR DESIGN FOR LARGE-AREA VHF PLASMA PROCESSING WITH IMPROVED UNIFORMITY

BACKGROUND

Field

Embodiments of the present disclosure generally relate to a system and apparatus for substrate processing. More specifically, embodiments of the present disclosure relate to a large-area VHF plasma processing.

Description of the Related Art

Plasma processing, such as plasma-enhanced chemical vapor deposition (PECVD), is commonly employed to deposit thin films on substrates to form electronic devices. As technology advances, device geometries, as structures formed on substrates, are continually increasing in complexity.

Additionally, the demand for electronic devices, such as larger LCDs and solar panels, also continues to grow and, in turn, so does the size of the substrates that are used to fabricate such devices. Accordingly, manufacturing processes, such as large-area VHF PECVD processes, must continue to improve in order to meet the increasingly difficult demands of attaining uniformity and desired film properties.

One challenge faced by large-area VHF PECVD processing is plasma non-uniformity due to the inherent standing wave effect generated by the VHF current used to form the plasma. The standing wave effect in the electromagnetic field formed above the substrate causes the formed plasma to bend towards the substrate proximate to the edge of the substrate. Such bending of the plasma causes differences in the ion trajectories bombarding the substrate proximate to the edge of the substrate as compared to the center of the substrate, thereby causing non-uniform processing of the substrate.

Accordingly, an apparatus that facilitates improved uniformity of a deposition process performed in a plasma processing chamber is needed.

SUMMARY

The present disclosure generally relates to an apparatus for plasma processing. More specifically, the present disclosure relates to an apparatus for providing plasma uniformity across the surface of a substrate during processing.

In one embodiment, a plasma processing chamber includes a chamber body and a lid coupled thereto defining a processing volume therein. A substrate support is disposed within the processing volume. A faceplate and a backing plate are coupled to the lid. The faceplate defines a plurality of apertures therethrough for delivery of a processing gas to a substrate. The backing plate has a rectangular shaped body with a pair of long sides and a pair of short sides. A plurality of ferrite blocks are disposed on each long side of the rectangular shaped body to modulate an RF current imposed by an RF generator.

In another embodiment, a plasma processing chamber includes a chamber body and a lid coupled thereto defining a processing volume therein. A substrate support is disposed within the processing volume. A faceplate and a backing plate are coupled to the lid. The faceplate defines a plurality of apertures therethrough for delivery of a processing gas to a substrate. The backing plate has a rectangular shaped body with a pair of long sides and a pair of short sides. A plurality of ferrite blocks is disposed within the backing plate to modulate an RF current imposed by an RF generator.

In yet another embodiment, a lid assembly includes a lid configured to couple to a chamber body. A backing plate, which has a support frame, is coupled to the lid. A faceplate is disposed proximate to the backing plate and, with the backing plate, defines a gas volume therebetween. A plurality of gas flow apertures is formed through the faceplate for delivery of a processing gas to a substrate. A plurality of ferrite blocks is coupled to the backing plate to modulate an electromagnetic field created by an RF current imposed by an RF generator.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 4A is a perspective view of a gas distribution assembly according to one embodiment.

FIG. 4B is a partial cross-sectional view of a peripheral region of the gas distribution assembly of FIG. 4A.

FIGS. 7A and 7B are perspective views of grounding straps according to one embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to an apparatus and method for processing substrates. In one aspect, a plasma processing chamber is provided which includes a chamber body and a lid. The lid includes a faceplate coupled to a backing plate. The faceplate and the backing plate are disposed within a processing volume defined by the chamber body and the lid. One or more ferrite blocks are coupled to the backing plate to modulate an electromagnetic field created by an RF current from an RF generator. A gas feed assembly including a gas source, a remote plasma source, and a zero field feed through are coupled to, and in fluid communication with, the processing volume through the backing plate and faceplate.

Figure 1:
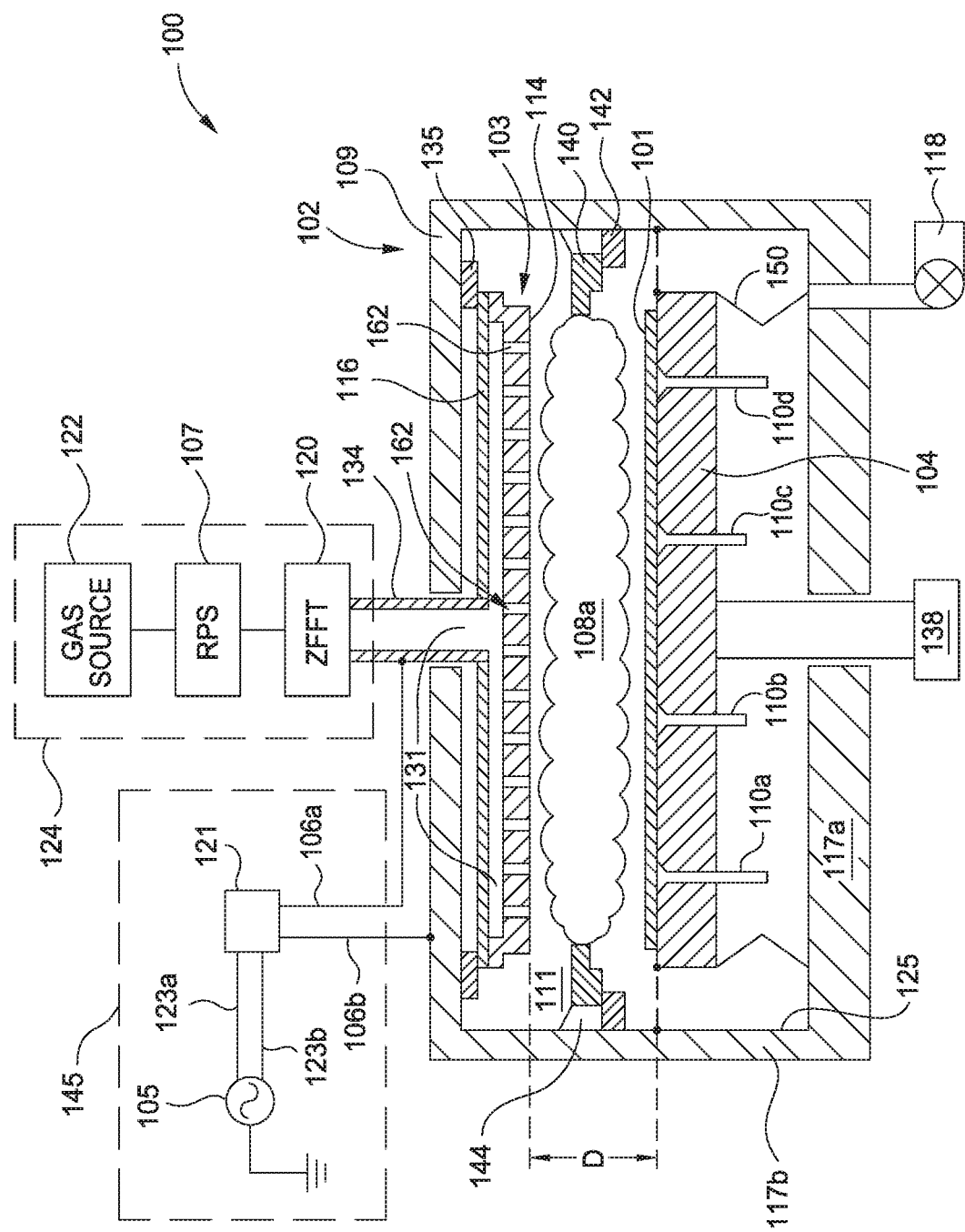
FIG. 1 is a schematic, cross-sectional view of an exemplary processing chamber according to certain embodiments.

FIG. 1 is a schematic cross-sectional view of one embodiment of a plasma processing system 100 configured to process large area substrates 101, though smaller substrates may be used herewith. The plasma processing system 100 includes a chamber body 102 having a bottom 117a and sidewalls 117b that partially define a processing volume 111. The sidewalls 117b support a lid 109. The lid 109 defines an upper boundary to the processing volume 111. A gas distribution assembly 103 is coupled to the lid 109. The gas distribution assembly 103 includes a backing plate 116 and a faceplate 114 coupled thereto. The gas distribution assembly 103 optionally includes an isolator 135 disposed between, and coupled to, the backing plate 116 and the lid 109. The faceplate 114 includes a plurality of gas flow apertures 162 formed therethrough. A conduit 134 is coupled to backing plate 116 at an opening formed therein. The conduit 134 extends from the backing plate 116 through the lid 109 away from the processing volume 111. A gas volume 131 is defined by the backing plate 116, the faceplate 114, and the conduit 134. An exemplary backing plate 116 and faceplate 114 are shown in FIG. 1. A more detailed description of embodiments of the backing plate 116 is provided in reference to FIGS. 2A-2B, 3A-3C, and 4A-4B. Similarly, detailed descriptions of the faceplate 114 are provided in reference to FIGS. 5A-5B.

A gas feed assembly 124 is coupled to the conduit 134. The gas feed assembly 124 includes a gas source 122, a remote plasma source (RPS) 107, and a zero field feed through (ZFFT) 120. The gas source 122 may be disposed proximate to the processing system 100 or disposed remotely therefrom. The gas source 122, the RPS 107, and the ZFFT 120 are coupled to the conduit 134 thereby forming a gas flow path therebetween. The gas feed assembly 124 is in fluid communication with the gas volume 131 through the conduit 134.

A VHF feed assembly 145 includes a VHF power generator 105 coupled to an impedance matching circuit 121 through a pair of leads 123a, 123b. An exemplary impedance matching circuit 121 includes a first lead 106a electrically coupled to the backing plate 116 through the conduit 134 and a second lead 106b electrically coupled to the lid 109. The impedance matching circuit 121 may also be electrically coupled directly to the backing plate 116. The leads 106a, 106b define VHF feeds for the VHF current to travel from the VHF power generator 105 to a coupling point with the chamber body 102. Here, the VHF power generator may produce an RF current with a frequency in a range of about 30 MHz to 300 MHz, such as 30 MHz to 100 MHz, like 40 MHz to 60 MHz. Different configurations of VHF feeds are discussed in reference to FIGS. 8A, 8B, and 8C.

A substrate support 104 is disposed in the processing volume 111 below the lid 109 and the gas distribution assembly 103 coupled thereto. The substrate support 104 includes a substrate support body disposed in the processing volume 111 and a shaft coupled thereto which extends out of the processing volume 111 through an opening in the bottom 117a of the chamber body 102. The substrate support 104 is coupled to, and moveable by, an actuator 138. The substrate 101 is removably disposed on a support surface of the substrate support 104 during processing. A plurality of lift pins 110a-110d are extendable through holes formed through the substrate support 104 to facilitate transfer of the substrate 101 to and from the substrate support 104. A plurality of grounding straps 150 electrically couple the substrate support 104 to the chamber body 102. Exemplary grounding straps 150 are shown in FIG. 1. Further details of the grounding straps 150 are discussed in reference to FIG. 6.

A shadow frame 140 is disposed between the gas distribution assembly 103 and the substrate support 104. The shadow frame 140 is supported by a support ring 142 and configured to be raised and lowered by contact with the substrate support 104. The shadow frame 140 is electrically coupled to the chamber body 102 by a plurality of grounding straps 144. Exemplary grounding straps 144 are shown in FIG. 1 with further details provided in relation to FIGS. 7A and 7B.

A vacuum system 118 is fluidly coupled to the processing volume 111. The exemplary vacuum system 118 includes a vacuum pump and a valve configured to control pressure within the processing volume 111.

During processing, the substrate 101 is disposed on the substrate support 104. One or more processing gases are flowed from the gas source 122 and into the gas volume 131 of the gas distribution assembly 103. The one or more processing gases distribute through the gas volume 131 before flowing into the processing volume 111 through the apertures 162 formed in faceplate 114. In certain operations, the RPS 107 delivers excited gas species to the gas volume 131 and the processing volume 111. The excited gas species from the RPS 107 may include activated gases for cleaning chamber components disposed in the processing volume 111 or activated processing gases. The one or more processing gases flow through the ZFFT 120 disposed between the gas source 122 and the gas volume 131. The ZFFT 120 minimizes parasitic plasma created by electrical fields present within the gas feed assembly 124, thereby reducing formation of particles therein. From the processing volume 111, the one or more processing gases are evacuated by the vacuum system 118 thereby forming a sub-atmospheric pressure environment in the processing volume 111.

In order to form a plasma 108a within the processing volume 111, an RF power is applied between the gas distribution assembly 103 and the substrate support 104. The gas distribution assembly 103 and the substrate support 104 are configured as opposing electrodes. Therefore, an RF current travel path for plasma generation is formed by the gas distribution assembly 103, the substrate support 104, and the chamber body 102.

An RF current is imposed by the VHF power generator 105 which travels from the first lead 123a of the VHF power generator 105 to the first lead 106a of the impedance matching circuit 121 which is electrically coupled to the conduit 134. The RF current then travels along an outer surface of the conduit 134 to a back surface of the backing plate 116 and then to a front surface of the faceplate 114 which faces the substrate support 104. The RF current couples to the substrate support 104 through the processing gases in the processing volume 111. The RF current excites the processing gases as the RF current travels from the faceplate 114 to the substrate support 104 thereby forming the plasma 108a. The RF current then travels from the substrate support 104 to an inner surface 125 of the chamber body 102 through the grounding straps 150 coupled therebetween. The RF current travels along the inner surface 125 of the chamber body 102, across the shadow frame 140 and support ring 142 through the grounding straps 144, and to the second lead 106b of the impedance matching circuit 121 through the lid 109. The RF current returns to the VHF power generator 105 through the second lead 123b thereof. The isolator 135 is formed from an insulating material thereby electrically isolating the lid 109 from the gas distribution assembly 103 which prevents the RF current from traveling from the gas distribution assembly 103 to the lid 109 bypassing the substrate support 104.

Uniformity of plasma distribution is generally desired during processing, pre-treatment, and/or post-treatment of the substrate 101. However, tuning of the plasma distribution may also be useful in certain processes. The distribution of the plasma 108a is determined by a variety of factors, such as distribution of the processing gas, geometry of the processing volume 111, the coupling distance between the gas distribution assembly 103 and the substrate support 104, variations between deposition processes on the same substrate or different substrates, differences in deposition processes and cleaning processes, and the arrangement of the chamber components such as the gas feed assembly 124 and/or the VHF feed assembly 145. The distance D between the substrate support 104 and the gas distribution assembly 103 may be adjusted during pre-treatment, post-treatment, processing, and/or cleaning by moving the substrate support 104 using the actuator 138.

Figure 2B:
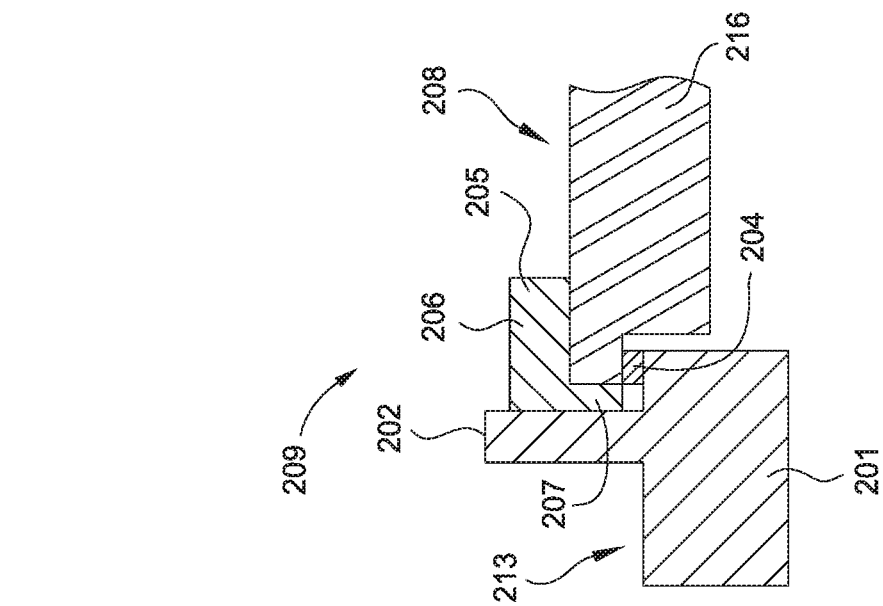
FIG. 2B is a partial cross-sectional view of a peripheral region of the gas distribution assembly of FIG. 2A.
Figure 2A:
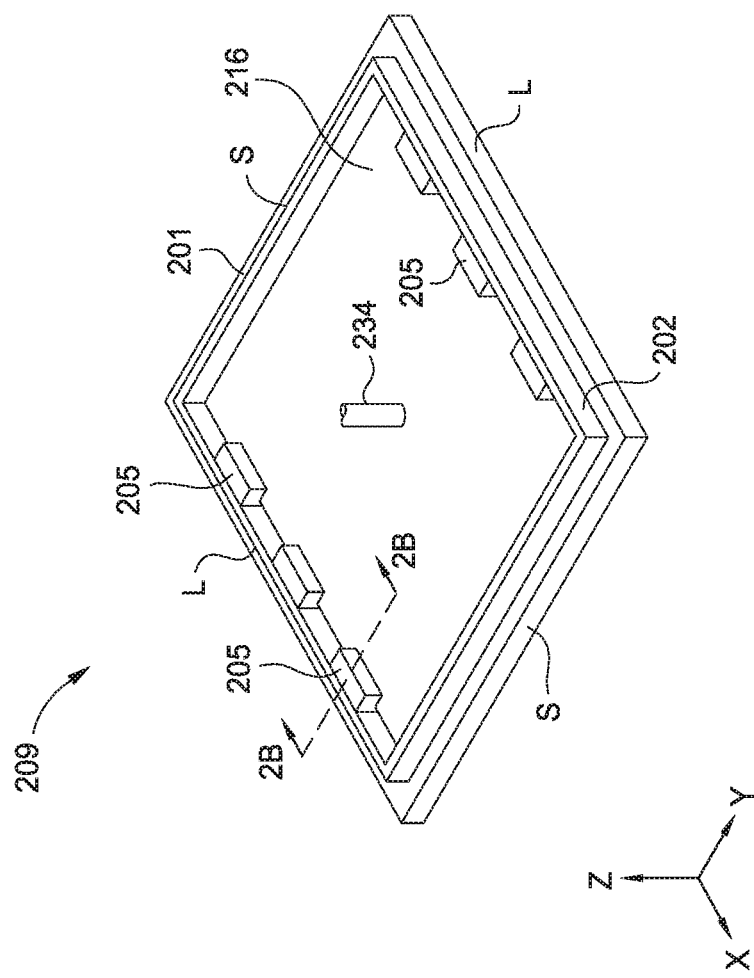
FIG. 2A is a perspective view of a gas distribution assembly according to one embodiment.

FIG. 2A is a perspective view of a gas distribution assembly 203 according to one embodiment. The gas distribution assembly 203 includes a backing plate 216 coupled to a support frame 201 and a faceplate (not shown). The backing plate 216 is generally formed from an electrically conductive material, such as aluminum. A conduit 234 is coupled to a central portion of the backing plate 216 which is further coupled to gas feed assembly (not shown), such as the gas feed assembly 124 of FIG. 1. A shroud 202 extends from an upper surface 213 of the support frame 201 and surrounds the backing plate 216. A spacer 204 is optionally disposed between the backing plate 216 and the support frame 201. In one embodiment, the spacer 204 is formed from an electrically insulating material thereby electrically isolating the backing plate 216 from the support frame 201. Here, the gas distribution assembly 203 has a rectangular shape defined by a pair of parallel long sides L in the "X" direction and a pair of parallel short sides S in the "Y" direction. The short sides S and the long sides L are perpendicular to one another. However, the gas distribution assembly 203 may be other shapes, such as square, circular, elliptical, or other useful shapes.

A plurality of ferrite blocks 205 is intermittently disposed along selective sides of the backing plate 216, e.g., each of the long sides L of the backing plate 216. As shown in FIG. 2B, which is a partial cross-sectional view of a peripheral portion of the gas distribution assembly 203 of FIG. 2A, the ferrite blocks 205 have an L-shaped cross-section defined by a horizontal portion 206 and a vertical portion 207. The horizontal portion 206 of each ferrite block 205 is disposed above, and coupled to, an upper surface 208 of the backing plate 216. The vertical portion 207 is coupled to the horizontal portion 206 at an end thereof and extends representatively downward therefrom. The vertical portion 207 is disposed in a gap formed between an edge of the shroud 202 facing towards the center of the gas distribution assembly 203 and an edge of the backing plate 216 facing away from the center of the gas distribution assembly 203. The vertical portion 207 extends below a plane defined by upper surface 208 of the backing plate 216. Each ferrite block 205 may be formed from a single, unitary billet of material or from multiple pieces thereof.

As shown, three ferrite blocks 205 are disposed along each side L of the backing plate 216, but other numbers, such as two, four, five, or more may be used. The ferrite blocks 205 are shown distributed evenly along the side L with a space formed between adjacent ferrite blocks 205. However, the position of the ferrite blocks 205 may be changed, such as, unevenly distributed, distributed along a single side, or abutting one another. Additionally, the ferrite blocks 205 may also be disposed along the side S or both the sides S and L.

The ferrite blocks 205 are formed from a ferritic material, such as iron, steel, or nickel-zinc alloys, among others. The ferromagnetic properties of the ferritic material modulate the magnetic field component of the electromagnetic field induced by the RF current traveling along the backing plate 216. The ferrite blocks reduce or even eliminate the magnetic field component of the electromagnetic field perpendicular to the plane defined by the ferrite blocks 205 (i.e., "Y" direction). The standing wave pattern in the "Y" direction is thereby extended outside of the ferrite blocks 205 and narrowed inside the ferrite bocks 205. The relative position and geometry of the ferrite blocks 205 determine the portion of the standing wave profile that is modulated by the ferrite blocks 205. By utilizing the L-shape cross-section of the ferrite blocks 205 of FIGS. 2A and 2B, the volume of ferritic material disposed on the backing plate 216 is increased. Therefore, the size and total number of blocks 205 is reduced compared to a single rectangular cross-section disposed above or below the backing plate 216.

Figure 3B:
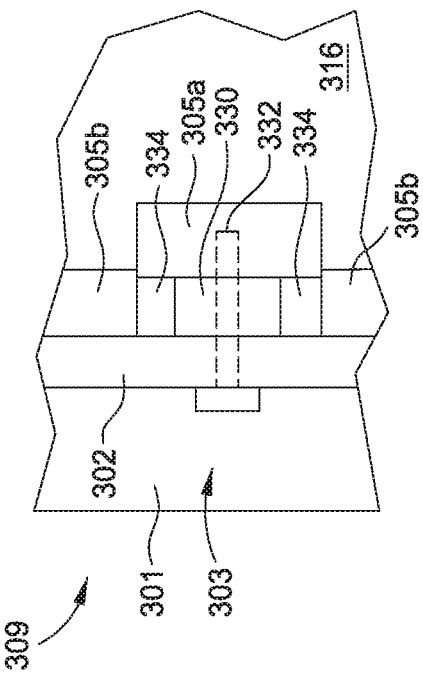
FIG. 3B is a partial cross-sectional view of a peripheral region of the gas distribution assembly of FIG. 3A.
Figure 3C:
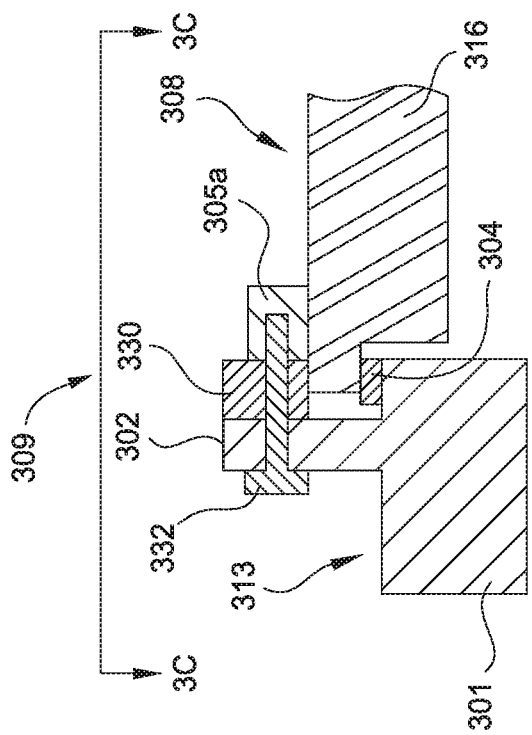
FIG. 3C is a plan view of a peripheral region of the gas distribution assembly of FIGS. 3A and 3B.
Figure 3A:
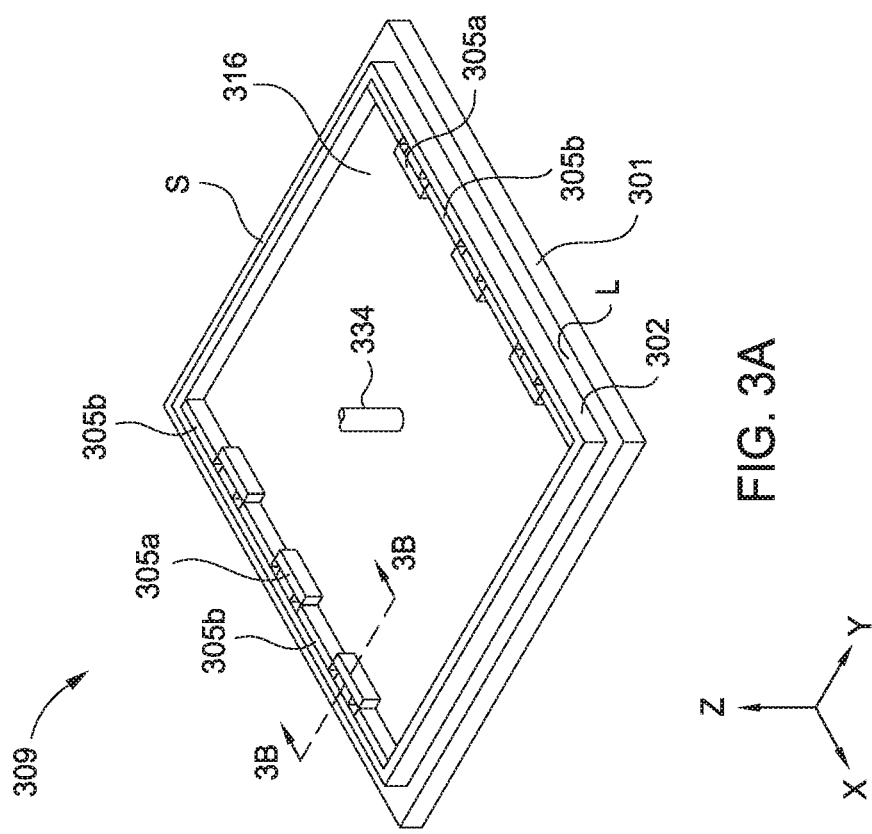
FIG. 3A is a perspective view of a gas distribution assembly according to one embodiment.

FIG. 3A is a perspective view of a gas distribution assembly 303 according to one embodiment. The gas distribution assembly 303 is similar to the gas distribution assembly 203, but utilizes a different arrangement of ferrite blocks 305.

As shown, a plurality of ferrite blocks 305 is disposed along each of the long sides L of the backing plate 316. A first group of ferrite blocks 305a are interleaved between, and abutting, a second group of ferrite blocks 305b in an offset configuration. The ferrite blocks 305b are disposed on the upper surface 308 of the backing plate 316 proximate to the shroud 302. The ferrite blocks 305a are also disposed on the upper surface 308 of the backing plate 316 but are offset from the shroud 302. Therefore, a small gap 334 is formed between the opposing faces of the ferrite blocks 305a and the shroud 302 as shown in FIG. 3C, which is a plan view of a peripheral portion of the gas distribution assembly 303. The ferrite blocks 305a, 305b are positioned such that a portion of the cross-sections overlap as shown in FIG. 3C. An outer surface of the ferrite blocks 305a (i.e., facing the shroud 302) is disposed radially outward from an inner surface (i.e., facing a central region of the backing plate 316) of the ferrite blocks 305b and radially inward of an outer surface (i.e., facing the shroud 302) of the ferrite block 305b. A plurality of clips 330 is optionally disposed in the gaps 334 between the ferrite blocks 305a and the shroud 302. The clips 330 are coupled to the shroud 302 by a threaded fastener 332 and fix the backing plate 316 to the support frame 301. FIG. 3B is a partial cross-sectional view of a peripheral region of the gas distribution assembly 303. FIG. 3B shows the threaded fastener 332 extending through the shroud 302 and the clip 330 and into the ferrite block 305a. Other arrangements of the ferrite blocks 305a, 305b may be utilized herewith. For example, the lengths, spacing, or location of the ferrite blocks 305a, 305b in relation to the clips 330 may be changed. Additionally, the ferrite blocks 305a, 305b may be also disposed along the sides S or both the sides S and L. The use of the offset configuration of the ferrite blocks 305a, 305b increases the number of blocks on the backing plate 316 which in turn produces stronger effects on the electromagnetic field.

FIG. 4A is a perspective view of a gas distribution assembly 403 according to one embodiment. The gas distribution assembly 403 is similar to the gas distribution assembly 203 and 303, but utilizes a different arrangement of ferrite blocks 405.

A plurality of ferrite blocks 405 is disposed in a plurality of recesses 406 formed in the backing plate 416. As shown in FIG. 4B, which is a partial cross-sectional view of a peripheral portion of the lid assembly 409, each recess 406 has a spacer 407 disposed between the ferrite block 405 and a cover 408. The spacer 407 is formed from a dielectric material, such as polyetheretherketone (PEEK) or polytetrafluoroethylene (PTFE). The cover 408 is formed from an electrically conductive material, such as aluminum. In one embodiment, the backing plate 416 and the cover 408 are formed from the same material. The spacer 407 isolates the cover 408 from the ferrite blocks 405 and the backing plate 416 and is thereby electrically "floating". A gap 410 is formed between the spacer 407 and the ferrite blocks 405. The distance of the gap 410 between the spacer 407 and the ferrite blocks 405 is, for example, between 1 mm and 3 mm, such as about 2 mm. Here, the recesses 406 having the ferrite blocks 405 therein are disposed in four rows parallel to the sides L. However, other arrangements of the recesses 406 and the ferrite blocks 405, such as a single row, discontinuous rows, or a combination thereof, may be utilized. Additionally, the recesses 406 and the ferrite blocks 405 may also be disposed along the side S or both the sides S and L. Embedding the ferrite blocks 405 in the backing plate 416 allows the size of the backing plate 416 to be reduced.

Figure 5A:
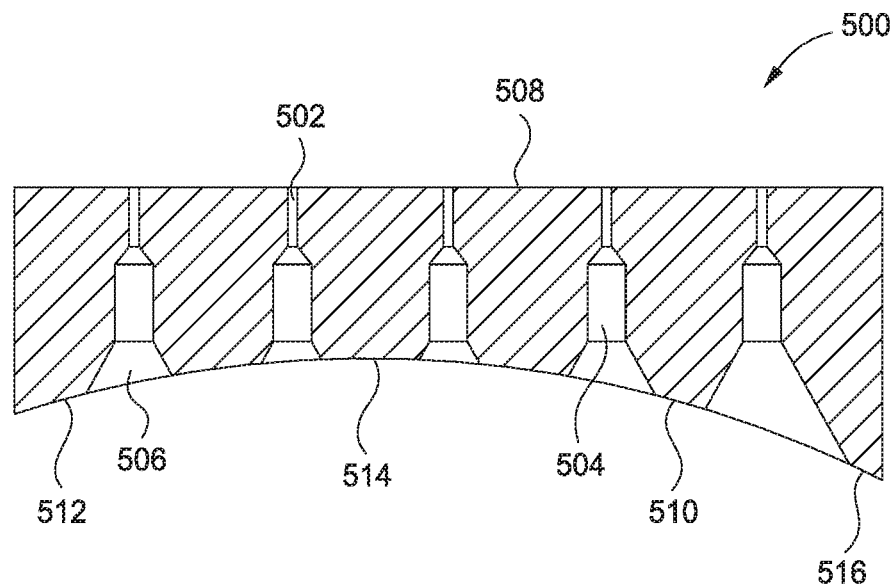
FIGS. 5A and 5B are exemplary cross-sectional views of faceplates according to certain embodiments.

FIG. 5A is a schematic cross-sectional view of a faceplate 500 according to one embodiment. The faceplate 500 has an upstream surface 508 and a downstream surface 510. Here, the upstream surface 508 is a substantially flat surface and the downstream surface 510 is asymmetrically curved. The downstream surface 510 has a concave portion 514 located off-center therefrom and curves asymmetrically to the first edge portion 516 and the second edge portion 512. In one embodiment, the concave portion 514 has a Gaussian shape. The downstream surface 510 may also be symmetrically curved wherein the concave portion 514 is centrally located on the downstream surface 510 and slopes symmetrically to the first edge portion 516 and the second edge portion 512.

A plurality of apertures is formed through the faceplate 500 by a top bore 502, a pinhole 504, and a hollow cathode cavity 506. The top bore 502 and the pinhole 504 of each gas passage are identical in cross-section across the faceplate 500. On the other hand, the hollow cathode cavities 506 differ in cross-section across the faceplate 500 due to the curvature of the downstream surface 510. For example, the hollow cathode cavities 506 located at a center of the faceplate 500 have a different cross-section than the hollow cathode cavities 506 located at the first edge portion 516 or the second edge portion 512 of the faceplate 500.

Figure 5B:
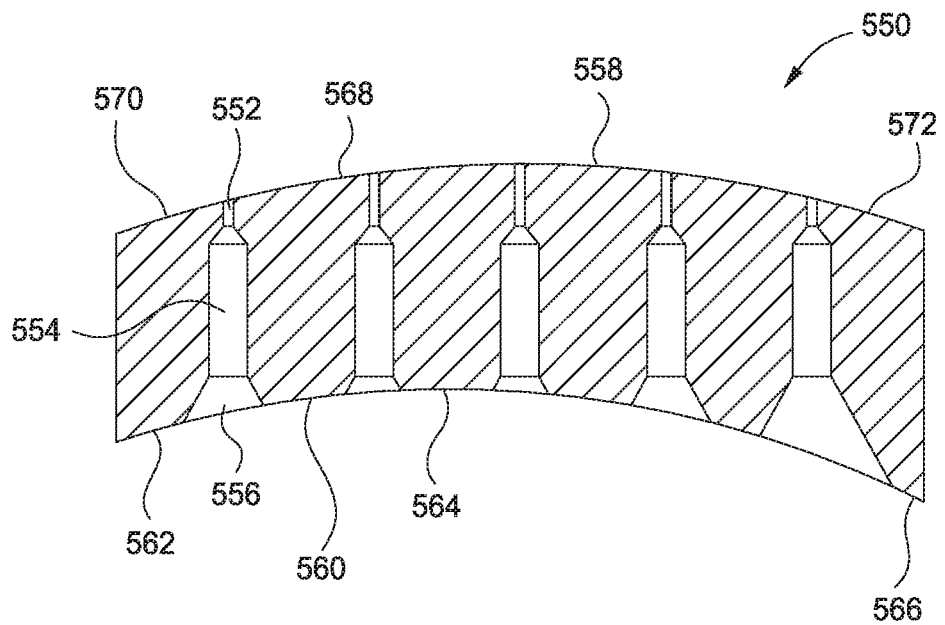

FIG. 5B is a schematic cross-sectional view of a faceplate 550 according to one embodiment. The faceplate 550 is like the faceplate 500 but has a curved upstream surface 558 and a curved downstream surface 560. Again, the downstream surface 560 has a concave portion 564 located off-center therefrom and slopes asymmetrically to the first edge portion 566 and the second edge portion 562. In one embodiment, the concave portion 564 has a Gaussian shape. Similarly, the upstream surface 558 has a convex portion 568 located off-center therefrom and slopes asymmetrically to a first edge portion 572 and a second edge portion 570. However, the convex portion 568 and the concave portion 564 may be centrally located wherein the upstream surface 558 and the downstream surface 560 both slope symmetrically to the respective first edge portions 572, 566 and second edge portions 570, 562.

A plurality of apertures is again formed through the faceplate 550 by a top bore 552, a pinhole 554, and a hollow cathode cavity 556. The apertures differ in cross-section across the faceplate 550 due to the curvature of the upstream surface 558 and the downstream surface 560.

The curved upstream surface 558 of FIG. 5B enables flow modulation by creating a gas flow gradient across the substrate counteracting the standing wave effect, thus improving plasma uniformity. The curved downstream surfaces 510, 560 of the faceplates 500, 550 modulate the coupling distance between the faceplate and the coupling electrode in the substrate support. Further, the curved downstream surfaces 510, 560 vary the cross section of the hollow cathode cavities 506, 556 which modulates the ion-flux distribution in the formed plasma, thereby compensating for the standing wave effect which improves uniformity.

Figure 6:
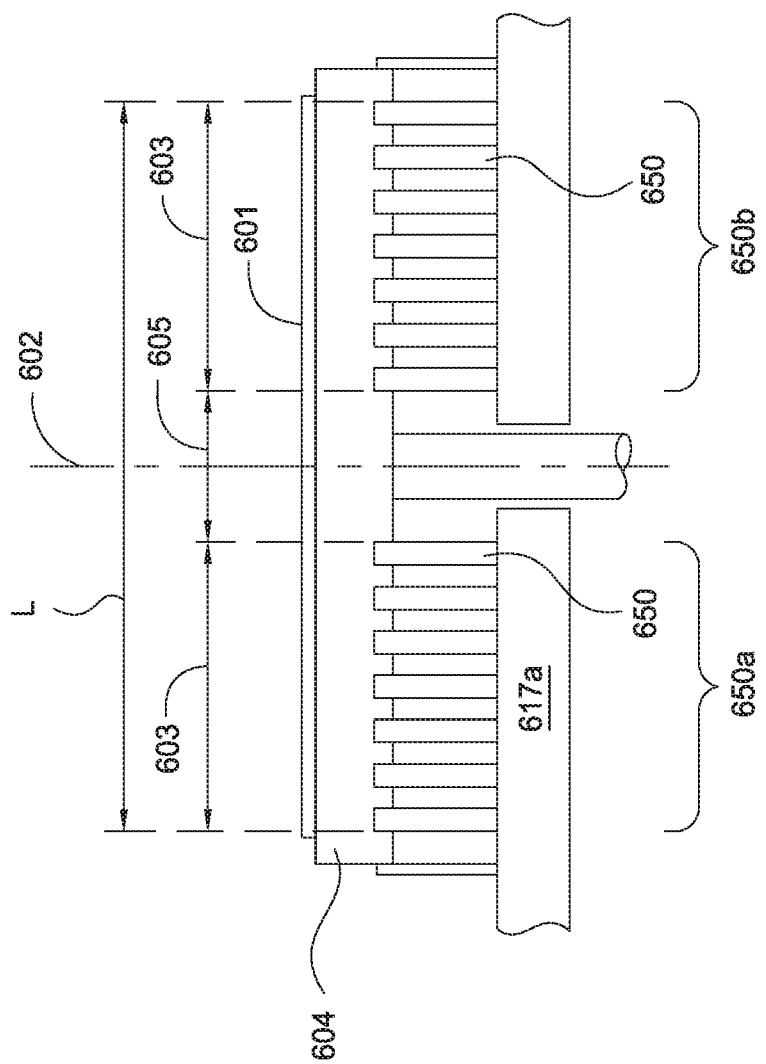
FIG. 6 is a side view of a substrate support according to one embodiment.

FIG. 6 is a side view of a substrate support 604 according to one embodiment. A plurality of grounding straps 650 electrically couple the substrate support 604 to the chamber bottom 617a. The grounding straps 650 are flexible, electrically conductive strips configured to ground the substrate support 604 without preventing movement thereof. In FIG. 6, the substrate support 604 is shown in a raised position such that the grounding straps 650 are fully extended.

Here, the substrate support 604 has rectangular shape. The long side of the substrate support 604 is shown. A length L is measured between the outermost grounding straps 650 disposed about a central axis 602 of the substrate support 604. The grounding straps 650 are configured in two groups 650a, 650b which are disposed on opposite sides of the axis 602. The groups 650a, 650b are symmetric about the central axis 602. Each of the groups 650a, 650b has a length 603 measured between the peripheral grounding strap 650 of each group 650a, 650b. A space 605 exists between the grounding straps 650 of the two groups 650a, 650b located proximate to the central axis 602. That is, a portion of the substrate support 604 corresponding to the space 605 does not have grounding straps 650 coupled thereto. The space 605 is symmetric about the central axis 602. The length of the space 605 is about 30% of the length L. The inventors have surprisingly discovered that leaving an uncovered portion of the substrate support, such as space 605 in the grounding area of the substrate support, results in significant improvements in the uniformity in plasma distribution due to modulations in the electromagnetic field from the change in grounding path across the substrate support.

In the embodiment of FIG. 6, the space 605 is present on a pair of opposing sides of the substrate support 604. However, other arrangements of the grounding straps 650 may be utilized herewith. For example, the space 605 may be present on one side, on three sides, on four sides, or on two adjacent sides. Further, the substrate support 604 may have other shapes, such as square, circular, or elliptical, among others.

FIGS. 7A and 7B are perspective views of an exemplary grounding strap 744 in different positions. The grounding strap 744 is formed from flexible, electrically conductive strips configured to ground the shadow frame (not shown) without preventing movement thereof. Here, the grounding strap 744 includes a lower segment 702, a middle segment 704, and an upper segment 706 disposed between adjacent pairs of shadow frame coupling blocks 740 and chamber coupling blocks 742.

The shadow frame coupling blocks 740 are coupled to, and moveable with, the shadow frame (not shown). The chamber coupling blocks 742 are also coupled to the grounding strap 744 and are fixed to the chamber body (not shown). Each chamber coupling block 742 is disposed between adjacent shadow frame coupling blocks 740.

In the lowered position of the shadow frame as shown in FIG. 7A, the lower segment 702 is overlapped by the middle segment 704 which is further overlapped by the upper segment 706 thereby forming an overlapping serpentine arrangement of the grounding strap 744 between each pair of shadow frame coupling blocks 740 and chamber coupling blocks 742. During operation, the shadow frame is raised in a direction represented by arrows 710. The lower segment 702 and the middle segment 702 are positioned adjacent to one another in a plane defined by the direction of travel of the shadow frame. Similarly, the middle segment 704 and the upper segment 706 are positioned adjacent to one another in the plane defined by the direction of travel of the shadow frame. In the raised position, shown in FIG. 7B, the lower segment 702, the middle segment 704, and the upper segment 706 are unfurled. That is, the lower segment 702, the middle segment 704, and the upper segment 706 are configured to allow the shadow frame to be raised and lowered to desired positions without limiting the movement thereof while electrically coupling to the shadow frame to chamber body. Here, the shadow frame is formed, for example, from a conductive material, such as uncoated aluminum. The uniformity of the formed plasma is enhanced using the grounded shadow frame by eliminating parasitic plasma which results in improved plasma confinement over the substrate, thereby increasing plasma uniformity. Additionally, the serpentine configuration improves reliability and useable life of the grounding strap by reducing mechanical degradation caused by the repeated cyclic movements of the shadow frame during processing operations.

Figure 8C:
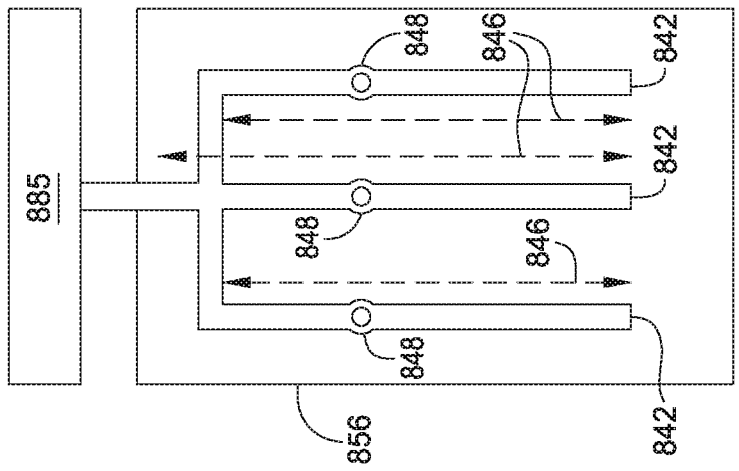
FIGS. 8A-8C are plan views of exemplary backing plates according to certain embodiments.
Figure 8B:
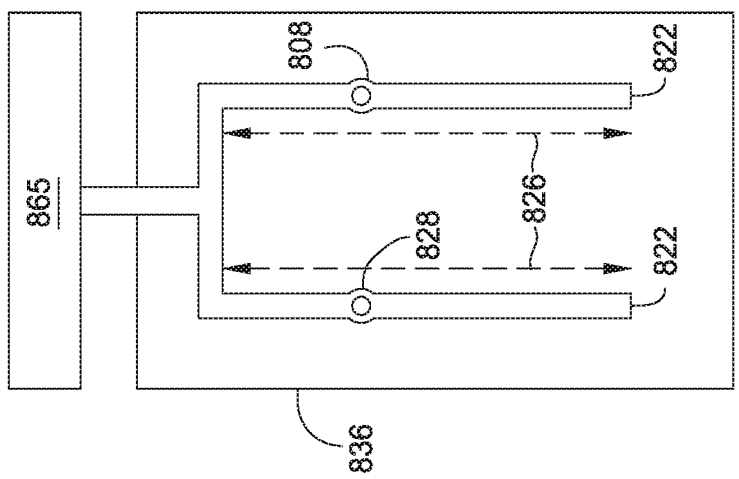
Figure 8A:
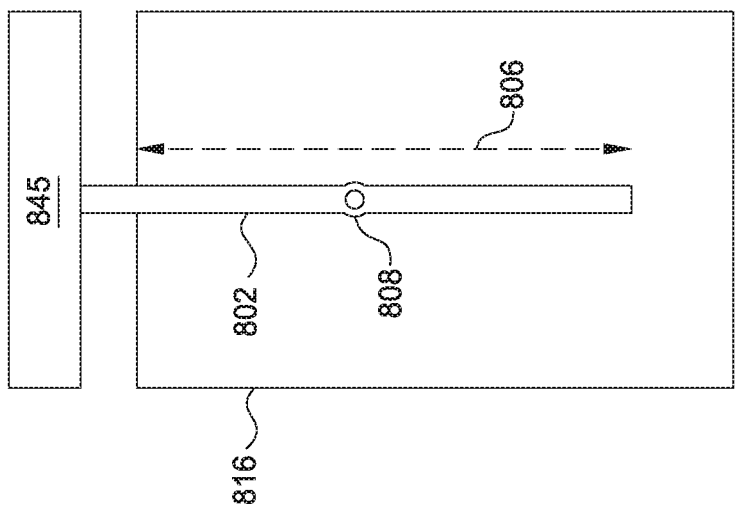

FIGS. 8A, 8B, and 8C are plan views of exemplary backing plates 816, 836, 856 and VHF feed assemblies 845, 865, 885, respectively. Here, the VHF feed assemblies 845, 865, 885 include a VFH power generator, like VHF power generator 105 of FIG. 1, and an impedance matching circuit, like impedance matching circuit 121 of FIG. 1.

In FIG. 8A, backing plate 816 and VHF feed assembly 845 are electrically coupled by a VHF feed 802 in a single branch arrangement. The VHF feed 802 forms a conductive path for the RF current generated by the VHF power generator through the impedance matching circuit to travel to a coupling point with the processing chamber, such as the backing plate of the gas distribution assembly. The VHF feed 802 is formed, for example, by an electrically conductive metal bar. Alternatively, the VHF feed 802 may be one or more electrically conductive wires.

Generally, the VHF feed 802 is coupled the backing plate 816 at a central region thereof by a physical offset feed (POF) 808. The POF 808 forms a conductive path for the RF current to travel from the VHF feed 802 to the backing plate 816. The POF 808 is formed, for example, by an electrically conductive metal bar coupled to the VHF feed 802 at a first end and to the backing plate 816 at a second end. Further, the POF 808 may be disposed along the VHF feed 802 in positions indicated by arrow 806. By offsetting the POF 808 at different locations, the electromagnetic field created by the RF current from the VHF feed assembly 845 is modulated which can compensate for local defects or discontinuities in the plasma. It is understood that the POF 808 may be positioned as suitable to control the formation of the plasma in the processing chamber. Further, the design of the VHF feed 802 and/or the POF 808, such as length, cross-section, impedance, or material, may be selected to conduct the RF current to generate a plasma in a desired manner.

In FIG. 8B, backing plate 836 and VHF feed assembly 865 are coupled by two VHF feeds 822. The VHF feeds 822 are like the VHF feed 802 but utilize a dual branch arrangement. The VHF feeds 822 are generally disposed symmetrically on the backing plate 836 and are each coupled thereto by a POF 828. Again, the POFs 828 may be disposed along the VHF feeds 822 in positions indicated by arrows 826.

In FIG. 8C, backing plate 856 and VHF feed assembly 885 are coupled by VHF feeds 842. The VHF feeds 842 are like the VHF feeds 822 but utilize a multi-branch arrangement. Here, three VHF feeds 848 are shown symmetrically disposed on the backing plate 856 and coupled thereto by POFs 848. However, other numbers of VHF feeds 842, such as four, five, or even more, may be utilized. Additionally, the POFs 828 may again be disposed in positions along the VHF feeds 842 as indicated by arrows 846.

While the foregoing is directed to embodiments of the present disclosure, other and further embodiments of the disclosure may be devised without departing from the basic scope thereof, and the scope thereof is determined by the claims that follow.

What is claimed is:

1. A plasma processing chamber, comprising:
   a chamber body;
   a lid coupled to the chamber body defining a processing volume;
   a substrate support disposed within the processing volume;
   a faceplate coupled to the lid having a plurality of apertures formed therethrough; and
   a backing plate disposed between the faceplate and the lid, the backing plate comprising:
      a rectangular shaped body having a pair of long sides and a pair of short sides;
      a plurality of ferrite blocks disposed within a plurality of recesses formed within the backing plate on each long side of the rectangular shaped body, the plurality of recesses each having a cover disposed within the recess, wherein a dielectric spacer is disposed between each ferrite block and each cover, the dielectric spacer disposed above the ferrite block, each dielectric spacer surrounding the respective cover and located between the respective cover and the backing plate; and
      wherein each ferrite block may be formed from as a single billet of material or of multiple pieces.

2. The plasma processing chamber of claim 1, wherein the plurality of ferrite blocks comprises intermittently spaced ferrite blocks defining a space between adjacent blocks.

3. The processing chamber of claim 1, wherein the recesses having the ferrite blocks therein are disposed in at least a single row along the long side of the rectangular shaped body.

4. The plasma processing chamber of claim 1, further comprising:
   a VHF power generator;
   one or more VHF feeds coupled to the power generator and the backing plate; and
   an impedance matching circuit coupled to the VHF power generator.

5. The plasma processing chamber of claim 1, further comprising a gas feed assembly in fluid communication with the processing volume, the gas feed assembly comprising:
   a gas source;
   a remote plasma source; and
   a zero field feed through.

6. The plasma processing chamber of claim 1, further comprising a shadow frame, wherein the shadow frame is electrically coupled to the chamber body by a plurality of grounding straps formed from a first portion, a second portion, and a third portion configured in an overlapping serpentine configuration.

7. The plasma processing chamber of claim 1, wherein the substrate support is coupled to the chamber body by a plurality of grounding straps.

8. The plasma processing chamber of claim 1, wherein the faceplate has either a curved first surface, a curved second surface, or both a curved first surface and a curved second surface.

9. A plasma processing chamber, comprising:
   a chamber body;
   a lid coupled to the chamber body defining a processing volume;
   a substrate support disposed within the processing volume;
   a faceplate coupled to the lid having a plurality of apertures formed therethrough; and
   a backing plate disposed between the faceplate and the lid, the backing plate comprising a plurality of ferrite blocks disposed within the backing plate, wherein each ferrite block of the plurality of ferrite blocks is disposed beneath a respective cover, and a dielectric spacer is disposed between each ferrite block and the respective cover, each dielectric spacer surrounding the respective cover and located between the respective cover and the backing plate, wherein each respective cover is disposed within a recess within the backing plate.

10. The plasma processing chamber of claim 9, further comprising:
    a VHF power generator;
    one or more VHF feeds coupled to the power generator and the backing plate; and
    an impedance matching circuit coupled to the VHF power generator.

11. The plasma processing chamber of claim 9, further comprising a gas feed assembly in fluid communication with the processing volume, the gas feed assembly comprising:
    a gas source;
    a remote plasma source; and
    a zero field feed through.

12. The plasma processing chamber of claim 9, further comprising a shadow frame, wherein the shadow frame is electrically coupled to the chamber body by a plurality of grounding straps formed from a first portion, a second portion, and a third portion configured in an overlapping serpentine configuration.

13. The plasma processing chamber of claim 9, wherein the substrate support is coupled to the chamber body by a plurality of grounding straps.

14. The plasma processing chamber of claim 9, wherein the faceplate has either a curved first surface, a curved second surface, or both a curved first surface and a curved second surface.

15. A lid assembly, comprising:
    a lid configured to couple to a chamber body;
    a backing plate having a support frame coupled to the lid;
    a faceplate disposed proximate to the backing plate defining a gas volume therebetween;
    a plurality of gas flow apertures formed through the faceplate;
    a plurality of ferrite blocks coupled to the backing plate, wherein each ferrite block of the plurality of ferrite blocks is disposed within a respective recess of a plurality of recesses within the backing plate, wherein the respective recess has a respective cover of a plurality of covers disposed within the respective recess, and wherein a dielectric spacer is disposed between each ferrite block and the respective cover, the dielectric spacer disposed above the ferrite block, each dielectric spacer surrounding the respective cover and located between the respective cover and the backing plate; and
    wherein each ferrite block may be formed from as a single billet or of multiple pieces.

16. The lid assembly of claim 15, wherein the plurality of ferrite blocks comprises intermittently spaced ferrite blocks defining a space between adjacent blocks.

17. The lid assembly of claim 15, wherein the recesses having the plurality of ferrite blocks disposed therein are disposed in at least a single row along the long side of the rectangular shaped body.

18. The processing chamber of claim 1, wherein the spacers and the ferrite blocks are separated by a gap.

19. The processing chamber of claim 18, wherein the gap is between about 1 mm and 3 mm.

20. The processing chamber of claim 1, wherein each dielectric spacer surrounds the sides and bottom of the cover.

21. The processing chamber of claim 1, wherein the backing plate includes a first surface facing away from the faceplate, and second surface facing toward the faceplate; and
    the plurality of recesses are formed within the backing plate and extend inwardly of the first surface of the backing plate.

22. The processing chamber of claim 9, wherein the backing plate includes a first surface facing away from the faceplate, and second surface facing toward the faceplate; and
    the plurality of recesses are formed within the backing plate and extend inwardly of the first surface of the backing plate.

23. The lid assembly of claim 15, wherein the backing plate includes a first surface facing away from the faceplate, and second surface facing toward the faceplate; and
    the plurality of recesses are formed within the backing plate and extend inwardly of the first surface of the backing plate.

* * * * *